US008289209B2

(12) United States Patent
Corman et al.

(10) Patent No.: US 8,289,209 B2
(45) Date of Patent: Oct. 16, 2012

(54) ACTIVE BUTLER AND BLASS MATRICES

(75) Inventors: David W. Corman, Gilbert, AZ (US); Donald Lawson Runyon, Duluth, GA (US)

(73) Assignee: ViaSat, Inc., Carlsbad, CA (US)

( * ) Notice: Subject to any disclaimer, the term of this patent is extended or adjusted under 35 U.S.C. 154(b) by 349 days.

(21) Appl. No.: 12/759,123

(22) Filed: Apr. 13, 2010

(65) Prior Publication Data
US 2010/0259446 A1 Oct. 14, 2010

Related U.S. Application Data

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
*H01Q 3/00* (2006.01)
(52) U.S. Cl. ...................................................... 342/373
(58) Field of Classification Search .................... 342/373
See application file for complete search history.

(56) References Cited

U.S. PATENT DOCUMENTS

| | | | |
|---|---|---|---|
| 3,119,965 A | 1/1964 | Phillips | |
| 4,318,104 A * | 3/1982 | Enein | 342/372 |
| 4,857,777 A | 8/1989 | Altes | |
| 4,896,374 A | 1/1990 | Waugh et al. | |
| 4,965,602 A | 10/1990 | Kahrilas et al. | |
| 4,994,773 A | 2/1991 | Chen et al. | |
| 5,045,822 A | 9/1991 | Mohwinkel | |
| 5,128,687 A * | 7/1992 | Fay | 343/754 |

(Continued)

FOREIGN PATENT DOCUMENTS
EP 0762660 3/1997
(Continued)

OTHER PUBLICATIONS

International Search Report and Written Opinion dated Jul. 19, 2010, PCT US10/030881,149 pages.

(Continued)

*Primary Examiner* — Harry Liu
(74) *Attorney, Agent, or Firm* — Snell & Wilmer

(57) ABSTRACT

In an exemplary embodiment, a monolithic active solution is configured to generate the fixed spatial beams of a Butler matrix operation or a Blass matrix operation. The exemplary Butler matrix comprises active RF hybrids and vector generators, and is designed for broadband performance in an ultra-compact size, which is size independent of the operating frequency. Furthermore, an exemplary Blass matrix comprises vector generators, active power combiners, and active power splitters. The Blass matrix is designed for broadband performance in an ultra-compact size, which is size independent of the operating frequency. Both the exemplary Butler matrix and exemplary Blass matrix may be configured generate steerable beams. Advantages of both the exemplary Butler matrix and exemplary Blass matrix include that they have neutral or slight positive power gain rather than high losses, and have ultra broadband range which enables operation over multiple frequency bands.

17 Claims, 10 Drawing Sheets

U.S. PATENT DOCUMENTS

| | | | |
|---|---|---|---|
| 5,270,719 | A | 12/1993 | Roth |
| 5,942,929 | A | 8/1999 | Aparin |
| 5,966,049 | A | 10/1999 | Yuen et al. |
| 6,005,515 | A * | 12/1999 | Allen et al. .................. 342/374 |
| 6,061,553 | A | 5/2000 | Matsuoka et al. |
| 6,232,837 | B1 | 5/2001 | Yoo et al. |
| 6,326,845 | B1 | 12/2001 | Miyaji et al. |
| 7,319,345 | B2 | 1/2008 | Farjad-rad et al. |
| 7,355,470 | B2 | 4/2008 | Sorrells et al. |
| 7,378,902 | B2 | 5/2008 | Sorrells et al. |
| 7,400,193 | B2 | 7/2008 | Wyatt |
| 7,408,507 | B1 | 8/2008 | Paek et al. |
| 7,420,423 | B2 | 9/2008 | Lee et al. |
| 7,421,036 | B2 | 9/2008 | Sorrells et al. |
| 7,620,129 | B2 | 11/2009 | Sorrells et al. |
| 7,672,653 | B2 | 3/2010 | Cowley et al. |
| 7,728,784 | B2 | 6/2010 | Mohamadi |
| 7,746,764 | B2 | 6/2010 | Rawlins et al. |
| 7,750,733 | B2 | 7/2010 | Sorrells et al. |
| 7,755,430 | B2 | 7/2010 | Imagawa |
| 7,885,682 | B2 | 2/2011 | Sorrells et al. |
| 8,013,784 | B2 * | 9/2011 | Margomenos et al. ....... 342/175 |
| 2002/0080084 | A1 * | 6/2002 | Strickland ..................... 343/837 |
| 2002/0113648 | A1 | 8/2002 | Miyaji et al. |
| 2002/0151274 | A1 * | 10/2002 | Rosen et al. ................. 455/12.1 |
| 2003/0016085 | A1 | 1/2003 | Yamazaki |
| 2003/0162566 | A1 | 8/2003 | Shapira et al. |
| 2004/0095190 | A1 | 5/2004 | Klaren |
| 2004/0119636 | A1 * | 6/2004 | Edvardsson et al. .......... 342/124 |
| 2004/0121750 | A1 | 6/2004 | Nation |
| 2004/0229584 | A1 | 11/2004 | Fischer et al. |
| 2005/0113052 | A1 | 5/2005 | Rabinovich |
| 2005/0151698 | A1 | 7/2005 | Mohamidi |
| 2006/0170499 | A1 | 8/2006 | Rahman et al. |
| 2007/0248186 | A1 | 10/2007 | Sorrells et al. |
| 2007/0275674 | A1 | 11/2007 | Chein |
| 2007/0280384 | A1 | 12/2007 | Hidaka |
| 2008/0129408 | A1 | 6/2008 | Nagaishi et al. |
| 2008/0129634 | A1 | 6/2008 | Pera |
| 2008/0218424 | A1 | 9/2008 | Blanton |
| 2009/0091384 | A1 | 4/2009 | Sorrells et al. |
| 2010/0073085 | A1 | 3/2010 | Sorrells et al. |
| 2010/0097138 | A1 | 4/2010 | Sorrells et al. |
| 2010/0225389 | A1 | 9/2010 | Teetzel |
| 2010/0321107 | A1 | 12/2010 | Honcharenko |

FOREIGN PATENT DOCUMENTS

| | | |
|---|---|---|
| EP | 1193861 | 4/2002 |
| JP | 2003168938 | 6/2003 |
| WO | WO9945609 | 8/1999 |
| WO | WO0003456 | 1/2000 |
| WO | WO0241442 | 5/2002 |
| WO | WO03036756 | 5/2003 |

OTHER PUBLICATIONS

International Search Report and Written Opinion dated Aug. 23, 2010, PCT/US2010/30864, 12 pages.

Kwang-Jin, Koh, Gabriel M. Rebeiz, 0.13-mu CMOS phase shifters for X-, Ku, and K-band phased arrays, IEEE Journal of Solid State Circuits, 2007, 14 pages.

Kwang-Jin, Koh, Jason W. May, Gabriel M. Rebeiz A Q-Band (40-45 GHZ) 16-Element Phased-Array Transmitter in 0.18-μm SiGe BiCMOS Technology, IEEE Radio Frequency Integrated Circuits Symposium, 2008, 4 pages.

Kwang-Jin, Koh, Gabriel M. Rebeiz, An X- and Ku-Band 8-Element Phased-Array Receiver in 0.18-μm SiGe BiCMOS Technology, IEEE Journal of Solid State Circuits, Jun. 2008, 12 pages.

Office Action dated Feb. 27, 2012 in U.S. Appl. No. 12/759,130.

Notice of Allowance dated Feb. 28, 2012 in U.S. Appl. No. 12/759,059.

Office Action dated May 7, 2012 in U.S. Appl. No. 12/759,113.

International Preliminary Report on Patentability dated Jul. 21, 2011 from PCT/US2010/030877.

International Preliminary Report on Patentability dated Jul. 21, 2011 from PCT/US10/30906.

International Preliminary Report on Patentability dated Jul. 21, 2011 from PCT/US10/30892.

Office Action dated Sep. 29, 2011 from U.S. Appl. No. 12/759,059.

Office Action dated Jan. 4, 2012 from U.S. Appl. No. 12/759,148.

Notice of Allowance dated Jul. 27, 2011 in U.S. Appl. No. 12/759,064.

International Preliminary Report dated Oct. 27, 2011 from PCT/US10/030864.

International Preliminary Report dated Oct. 27, 2011 from PCT/US10/30868.

International Preliminary Report dated Oct. 27, 2011 from PCT/US10/030881.

International Preliminary Report dated Oct. 27, 2011 from PCT/US10/30872.

International Preliminary Report dated Oct. 27, 2011 from PCT/US10/30871.

International Preliminary Report dated Oct. 27, 2011 from PCT/US10/30866.

International Preliminary Report dated Oct. 27, 2011 from PCT/US10/030876.

USPTO; Office Action dated Apr. 7, 2011 in U.S. Appl. No. 12/759,064.

Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.

Ayari et al., "Automatic Test Vector Generation for Mixed-Signal Circuits," 1995, Ecole Polytechnique of the University of Montreal, 6 pages.

Strassberg, Dan, "RF-vector-signal generator combines high throughput, low phase noise," EDN, Oct. 6, 2009, 2 pages, UBM Electronics.

International Search Report and Written Opinion dated Oct. 27, 2010, PCT/US10/030876, 8 pages.

International Search Report and Written Opinion dated Nov. 18, 2010, PCT/US10/30871, 10 pages.

International Search Report and Written Opinion dated Nov. 26, 2010, PCT/US10/30868, 10 pages.

International Search Report and Written Opinion dated Nov. 26, 2010, PCT/US10/30877, 10 pages.

Tokumitsu et al.—Active isolator, combiner, divider and magic-T as miniaturized function blocks dated Nov. 6, 1998.

International Search Report and Written Opinion dated Nov. 26, 2010, PCT/US10/30866, 8 pages.

Aminghasem Safarian et al., Distributed Active Power Combiners and Splitters for Multi-Antenna UWB, 2006 IEEE.

Viallon et al. An Original SiGe Active Differential Output Power Splitter for Millimetre-wave Applications, 2003.

International Search Report and Written Opinion dated Nov. 26, 2010, PCT/US10/30892, 9 pages.

International Search Report and Written Opinion dated Nov. 26, 2010, PCT/US10/30872, 9 pages.

Hsiao Analysis of Interleaved Arrays of Nov. 1971.

International Search Report and Written Opinion dated Nov. 30, 2010, PCT/US10/30906, 11 pages.

Aminghasem Safarian et al., "Distributed Active Power Combiners and Splitters for Multi-Antenna UWB Transceivers" Sep. 2006, pp. 138-141.

Supplemental Notice of Allowability dated Jun. 11, 2012 in U.S. Appl. No. 12/759,130.

Notice of Allowance dated May 10, 2012 in U.S. Appl. No. 12/759,130.

Office Action dated May 17, 2012 in U.S. Appl. No. 12/759,043.

Supplemental Notice of Allowability dated May 29, 2012 in U.S. Appl. No. 12/759,130.

Office Action dated Aug. 2, 2012 in U.S. Appl. No. 12/758,996.

Final Office Action dated Dec. 5, 2012 in U.S. Appl. No. 12/759,148.

\* cited by examiner

ACTIVE BUTLER AND BLASS MATRICES

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND OF THE INVENTION

A beam forming network combines multiple signals to produce a composite signal that points in a particular direction in space. The beam forming network can be used for transmit, receive, or transmit and receive applications and is often capable of generating multiple simultaneous beams each of which benefit from the full radiating aperture. Various types of beam forming networks that form fixed spatial beams are known, including a Butler matrix and a Blass matrix.

A typical Butler matrix is made of a variety of quadrature hybrids, fixed phased shifters, and extensive coaxial cables to connect the components. The typical Butler matrix forms a group of multiple beams fixed in space, where the beams are non-steerable and each beam points to a unique position in space. Depending on whether transmitting or receiving, a Butler matrix connects each radio frequency (RF) input to the matrix to a unique beam output, or connects each RF output to the matrix to a unique beam input. Typically, the Butler matrix is physically large, expensive, only operates over a narrow bandwidth of usually about 10%, and suffers from high RF loss, often greater than 20 dB.

Additionally, a typical Blass matrix is made of a variety of fixed phased shifters or delay lines, directional couplers, and transmission lines. The typical Blass matrix provides for an arbitrary number of beams to be transmitted or received to or from an arbitrary number of radiating elements. As with the Butler matrix, a conventional Blass matrix forms a group of multiple beams fixed in space, where the beams are non-steerable and each beam points to a unique position in space. One typical embodiment involves each radiating element feeding a single RF signal path (also referred to as a row). The beams are formed by each column sampling energy from each row. A wideband beam forming/sensing network is formed by inserting a fixed time delay along each row between the beam coupling points.

A Blass matrix uses a variety of directional couplers that are situated along the rows whose coupling coefficients ascend in value as one gets farther from the radiating element. The coupling values ascend in value since each instance that energy is coupled off the incoming signal, a smaller outgoing signal results. By having coupling values ascend, all samples from the various rows couple equal signal levels into each beam.

Various disadvantages of a typical Blass matrix includes that it may be very large, heavy, and expensive, especially when implemented in a waveguide with delay lines. Moreover, even if such a Blass matrix is implemented in planar media like a microstrip or stripline, the implementation is still physically large and expensive. Furthermore, a typical Blass matrix is very lossy, even if couplers with small coupling values are used and only generates non-steerable beams.

As stated above, a prior art beam forming network matrix may include a digital fixed phase shifter and phase generating quadrature hybrid. In the prior art, a typical implementation for a digital phase shifter uses a switched delay line architecture resulting in a solution that is physically large and operates over a narrow band of frequencies due to its distributed nature. Another typical digital phase shifter implements a switched high-pass low-pass filter architecture, which has better operating bandwidth compared to a switched delay line but is still physically large. Also, the phase shifter is often made on gallium arsenide (GaAs). Though other materials may be used, GaAs is a higher quality material designed and controlled to provide good performance of electronic devices. However, in addition to being a higher quality material than other possible materials, GaAs is also more expensive and more difficult to manufacture. The typical phased array components take up a lot of area on the GaAs, resulting in higher costs. Furthermore, a standard phase shifter has high RF power loss, which is typically about n+1 dB of loss, where n is the number of phase bits in the phase shifter. Another prior art embodiment uses RF MEMS switches and has lower power loss but still consumes similar space and is generally incompatible with monolithic solutions.

Furthermore, the typical components in a phased array antenna are distributed components that are therefore frequency sensitive and designed for specific frequency bands.

Quadrature hybrids or other differential phase generating hybrids are used in a variety of RF applications. In an exemplary embodiment, quadrature hybrids are for power combining or power splitting. In an exemplary embodiment, the outputs of a quadrature hybrid have substantially equal amplitude and approximately a 90° phase difference. In another typical embodiment, the quadrature hybrid is implemented as a distributed structure, such as a Lange coupler, a branchline coupler, or a ring hybrid. Other quadrature hybrids, such as a magic tee or a ring hybrid, result in a 180° phase shift. In general, a quadrature hybrid is limited in frequency band and requires significant physical space. Moreover, the quadrature hybrid is typically made of GaAs and has associated RF power loss on the order of 3-4 dB per hybrid when used as a power splitter and an associated RF power loss of about 1 dB when used as a power combiner.

Hybrids may be configured as in-phase power combiners and in-phase power splitters, which are also used in a variety of RF applications. In an exemplary embodiment, the outputs of an in-phase hybrid have approximately equal amplitude and approximately zero differential phase difference. In another exemplary embodiment, the inputs of an in-phase hybrid configured as a power combiner encounter substantially zero differential phase and amplitude shift. In a typical embodiment, the in-phase hybrid is implemented as a distributed structure such as a Wilkinson hybrid. In general, an in-phase hybrid is limited in frequency band and requires significant physical space. The in-phase hybrid is typically made of GaAs. Moreover, the in-phase hybrid generally has associated RF power loss on the order of 3-4 dB per hybrid when used as a power splitter and an associated RF power loss of about 1 dB when used as a power combiner.

Thus, a need exists for a beam forming network that is not frequency limited. Furthermore, the beam forming network should be able to be manufactured on a variety of materials and with little or no associated RF power loss. Also, a need exists for a beam forming network that uses less space than a similar capability prior art network, and is suitable for a monolithic implementation.

SUMMARY

In an exemplary embodiment, a monolithic active solution is configured to generate the fixed spatial beams of a Butler matrix operation. The exemplary Butler matrix comprises active RF hybrids and vector generators, and is designed for broadband performance in an ultra-compact size, which is size independent of the operating frequency. The active RF hybrid and vector generator are active implementations of RF quadrature hybrids and phase shifters used in prior art embodiments. Furthermore, in an exemplary embodiment, the vector generator is digitally set and not further adjusted. Additionally, in an exemplary embodiment, the active hybrids and vector generators may be designed to have positive gain, matched input/output ports, and isolation between ports.

Furthermore, in an exemplary embodiment, a monolithic active solution is configured to generate the fixed spatial beams inherent in Blass matrix operation. An exemplary Blass matrix comprises vector generators, active power combiners, and active power splitters. The Blass matrix combines active implementations to replace RF couplers and time delay elements, and is designed for broadband performance in an ultra-compact size, which is size independent of the operating frequency. Additionally, in an exemplary embodiment, the active power combiners, active power splitters, and vector generators may be designed to have positive gain, matched input/output ports, and isolation between RF ports.

Advantages of both the exemplary Butler matrix and exemplary Blass matrix include that they are fully monolithic solutions, have neutral or slight positive power gain rather than high losses, and have ultra broadband range which enables operation over multiple frequency bands. Additionally, in an exemplary embodiment, both matrices are designed to be ultra-compact and not incorporate distributed structures, such that the physical size is independent of the operating frequency. In an exemplary embodiment, the matrices are designed to have matched input/output ports and provide isolation between the ports. Furthermore, an exemplary matrix may be manufactured on SiGe for lower cost, and incorporate differential signaling on the chip, which confines the electromagnetic fields and improves isolation and noise immunity.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

A Butler matrix is a type of fixed beam forming network, in which each RF input into the matrix is connected to a unique beam output which is fixed in space. In an exemplary embodiment, an active Butler matrix comprises multiple vector generators and multiple active hybrids. A Blass matrix is another type of fixed beam forming network that provides for beams fixed in space. The Blass matrix establishes the number of beams formed independent of the number of radiating elements. In an exemplary embodiment, an active Blass matrix comprises multiple active power combiners, multiple active power splitters, and multiple vector generators. Furthermore, the embodiments described in this application may include passive components in place of the active components so long as at least one active component is present.

Figure 1:
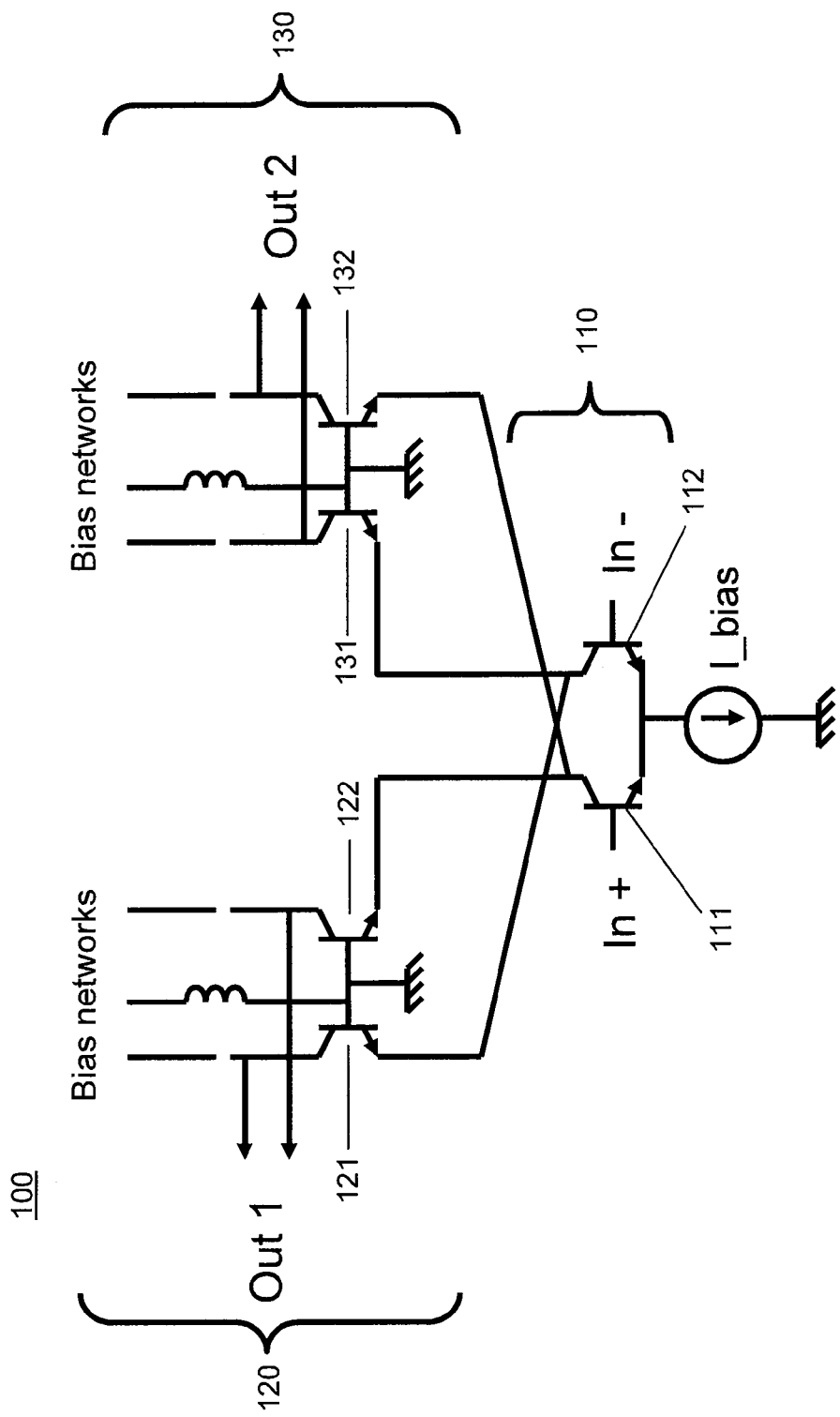
FIG. 1 illustrates an exemplary embodiment of an active power splitter.

Active Splitter: FIG. 1 illustrates a schematic of an exemplary active power splitter. In an exemplary embodiment, an active power splitter 100 comprises a differential input subcircuit 110, a first differential output subcircuit 120, and a second differential output subcircuit 130. The differential input subcircuit 110 has paired transistors 111, 112 with a common emitter node and is constant current biased, as is typical in a differential amplifier. An input signal is communicated to the base of paired transistors 111, 112 in the differential input subcircuit 110. Both the first and second differential output subcircuits 120, 130 comprise a pair of transistors with a common base node and each common base is connected to ground.

The first differential output subcircuit 120 has a first transistor 121 emitter connected to the collector of one of the input subcircuit transistors 112. The emitter of the second output subcircuit transistor 122 is connected to the collector of the other input subcircuit transistor 111. In the exemplary embodiment, the first output is drawn from the collectors of transistors 121, 122 of the first differential output subcircuit 120. Furthermore, the second differential output subcircuit 130 is similarly connected, except the transistor 131, 132 emitters are inversely connected to the input subcircuit transistor 111, 112 collectors with respect to transistors 121, 122.

By inverting the input subcircuit transistor collector connections between the first and second differential output subcircuits, the first output and the second output are approximately 180° out of phase with each other. In another exemplary embodiment, transistor 131, 132 emitters are non-inversely connected to input subcircuit transistor 111, 112 collectors, causing the first output and the second output to be approximately in phase with each other. In general, the absolute phase shift of the output signals through the power splitter is not as important as the relative phasing between the first and second output signals.

In an exemplary embodiment, active power splitter 100 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 100, can provide gain and the relative power level between the input signal and the output signal is adjustable and can be selectively designed. In an exemplary embodiment, the output signal is configured to achieve a substantially neutral or positive power gain over the input signal. For example, the output signal may achieve a 3 dB signal power gain over the input signal. In an exemplary embodiment, the output signal may be configured to achieve a power gain in the 0 dB to 5 dB range. Moreover, the output signal may be configured to achieve any suitable power gain.

In accordance with an exemplary embodiment, active power splitter 100 produces output signals with a differential phase between the two signals that is zero or substantially zero. The absolute phase shift of output signals through the active power splitter may not be as important as the relative phasing between the output signals.

In another exemplary embodiment, active power splitter 100 additionally provides matched impedances at the input and output ports. The matched impedances may be 50 ohms, 75 ohms, or other suitable impedances. Furthermore, in an exemplary embodiment, active splitter 100 provides isolation between the output ports of the active power splitter. In one exemplary embodiment, active power splitter 100 is manufactured as a MMIC with a compact size that is independent of the operating frequency due to a lack of distributed components.

Figure 2:
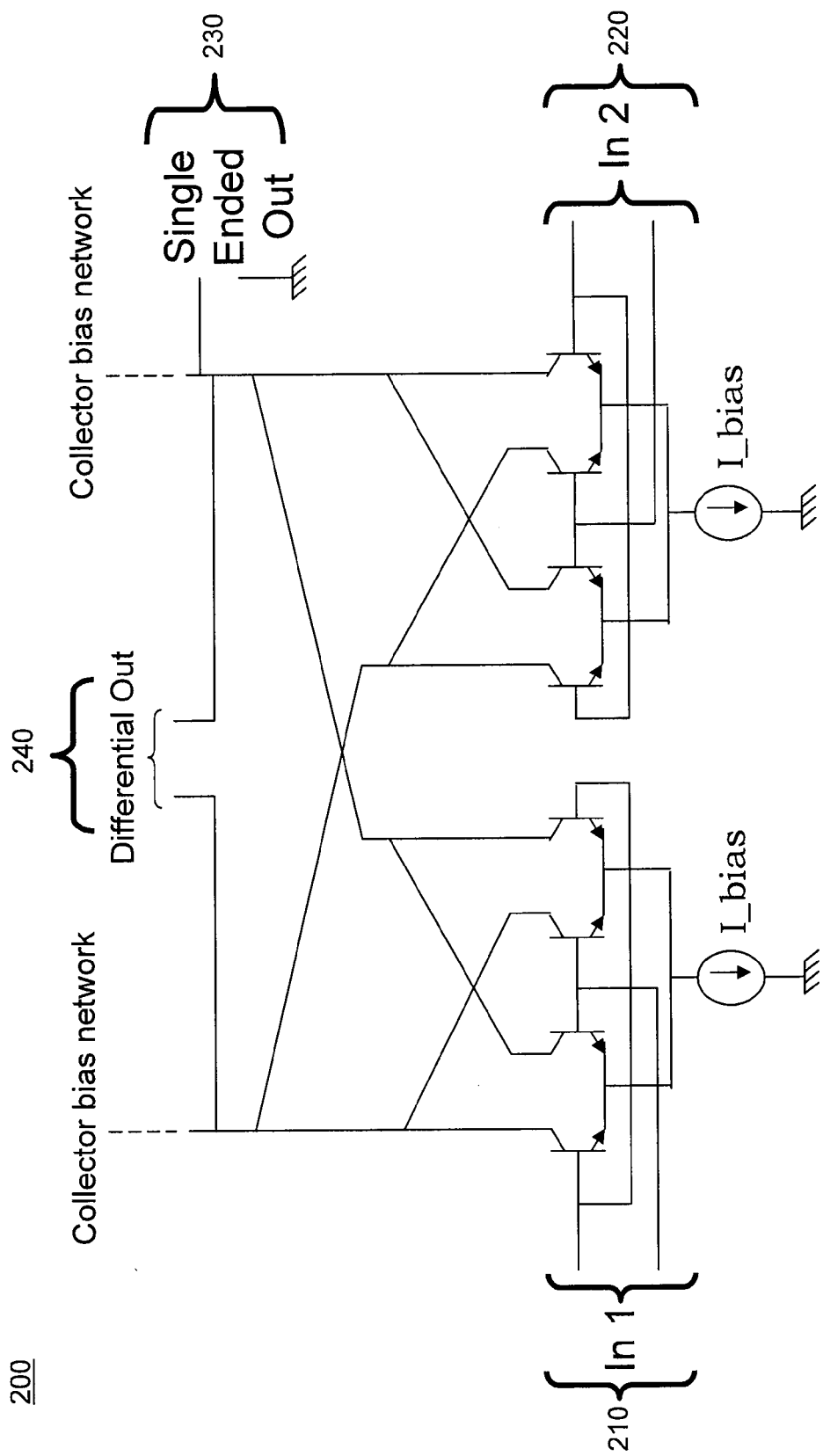
FIG. 2 illustrates an exemplary embodiment of an active power combiner.

Active Combiner: In an exemplary embodiment and with reference to FIG. 2, an active power combiner 200 comprises a first differential input subcircuit 210, a second differential input subcircuit 220, a single ended output subcircuit 230, and a differential output subcircuit 240. Each differential input subcircuit 210, 220 includes two pairs of transistors, with each transistor of each differential input subcircuit 210, 220 having a common emitter node with constant current biasing, as is typical in a differential amplifier.

A first input signal is communicated to the bases of the transistors in first differential input subcircuit 210. For example, a first line of input signal In1 is provided to one transistor of each transistor pair in first differential input subcircuit 210, and a second line of input signal In1 is provided to the other transistor of each transistor pair. Similarly, a second input signal is communicated to the bases of the transistors in second differential input subcircuit 220. For example, a first line of input signal In2 is provided to one transistor of each transistor pair in first differential input subcircuit 220, and a second line of input signal In2 is provided to the other transistor of each transistor pair. Furthermore, in an exemplary embodiment, a differential output signal is formed by a combination of signals from collectors of transistors in first and second differential input subcircuits 210, 220.

In an exemplary embodiment, active power combiner 200 converts two input RF signals into a single output signal. The output signal can either be a single ended output at single ended output subcircuit 230, or a differential output at differential output subcircuit 240. In other words, active power combiner 200 performs a function that is the inverse of active power splitter 100. The input signal levels can be of arbitrary amplitude and phase. Similar to an active power splitter, active power combiner 200 can provide gain and the relative power level between the inputs and output is also adjustable and can be selectively designed. In an exemplary embodiment, the output signal achieves a substantially neutral or positive signal power gain over the sum of the input signals. For example, the output signal may achieve a 3 dB power gain over the sum of the input signals. In an exemplary embodiment, the output signal may achieve a power gain in the 0 dB to 5 dB range. Moreover, the output signal may achieve any suitable power gain.

In an exemplary embodiment, active power combiner 200 additionally provides matched impedances at the input and output ports. The matched impedances may be 50 ohms, 75 ohms, or other suitable impedances. Furthermore, in an exemplary embodiment, active power combiner 200 provides isolation between the input ports of the power combiner. In one exemplary embodiment, active power combiner 200 is manufactured as a MMIC with a compact size that is independent of the operating frequency due to a lack of distributed components.

Figure 3:
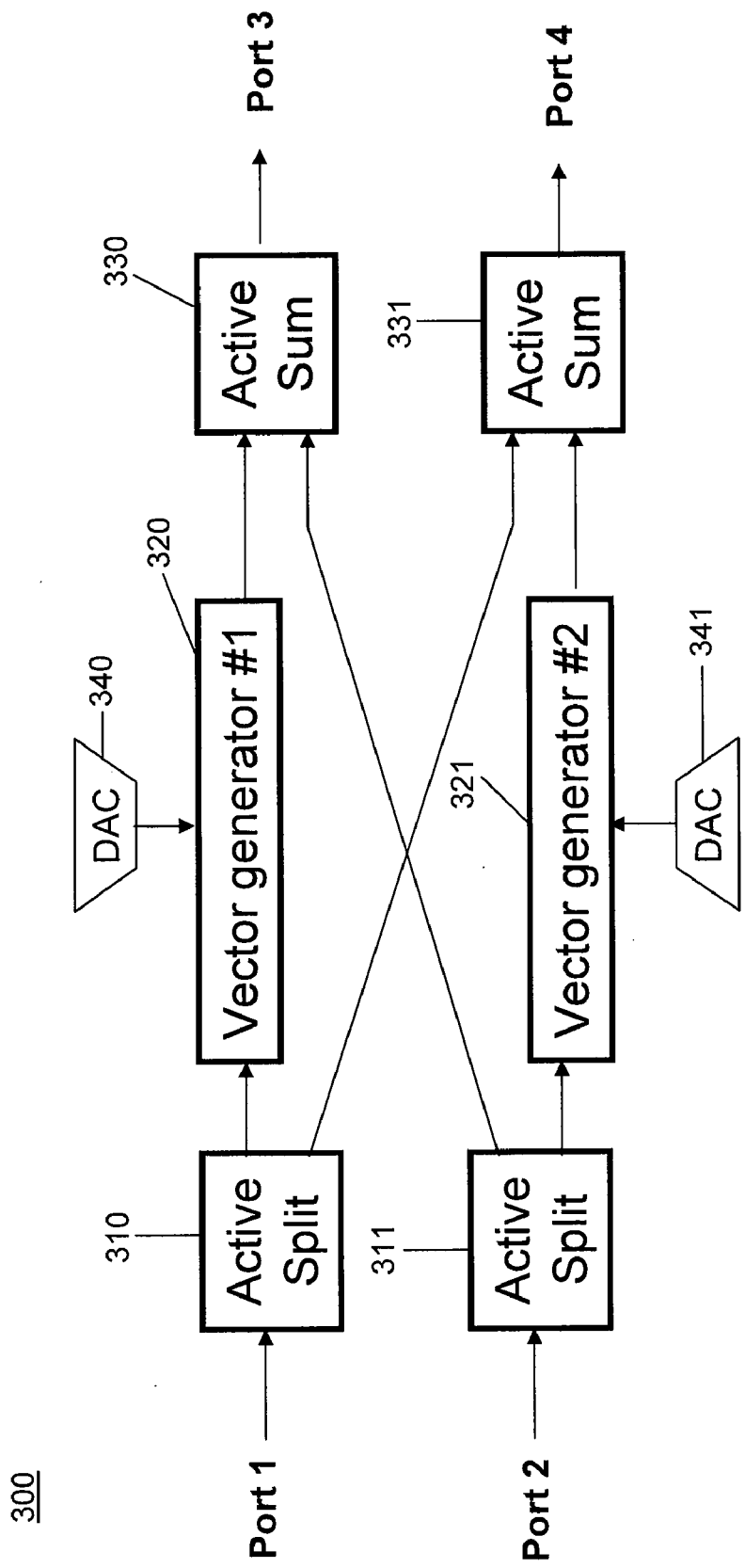
FIG. 3 illustrates an exemplary embodiment of an active RF hybrid.

Active RF Hybrid: In an exemplary embodiment, and with reference to FIG. 3, an active RF hybrid 300 comprises a first active power splitter 310, a second active power splitter 311, a first vector generator 320, a second vector generator 321, a first active power combiner 330, a second active power combiner 331, a first digital-to-analog converter (DAC) 340 and a second DAC 341. In accordance with the exemplary embodiment, first active power splitter 310 receives an input at Port 1 and communicates the input to first vector generator 320 and second active power combiner 331. Likewise, second active power splitter 311 receives an input at Port 2 and communicates the input to second vector generator 321 and first active power combiner 330. Vector generators 320, 321 are controlled in part by respective DACs 340, 341. In an exemplary embodiment, a 4-bit DAC is used but any number of bits many be used.

Furthermore, the output of first vector generator 320 is communicated to first active power combiner 330, and the output of second vector generator 321 is communicated to second active power combiner 331. In the exemplary embodiment, first active power combiner 330 receives input from first vector generator 320 and second active power splitter 311, and outputs a signal to Port 3. Similarly, second active power combiner 331 receives input from second vector generator 321 and first active power splitter 310, and outputs a signal to Port 4.

Active RF hybrid 300 may be used to replace various distributed components, such as a branchline coupler, Lange coupler, directional coupler, or 180° hybrid. In accordance with an exemplary embodiment, an active RF hybrid provides similar functionality in comparison to a traditional distributed hybrid. For example, active RF hybrid 300 may be dynamically configured to have adjustable phase differences between the output ports, which could be 90°, 180°, or some other phase difference. Another example is that active RF hybrid 300 provides port-to-port isolation and matched impedances at the input/output ports. Additional information regarding active RF hybrids is disclosed in the U.S. patent application entitled "ACTIVE RF HYBRIDS", Ser. No. 12/759,043, filed the same day as this application is hereby incorporated by reference.

Furthermore, active RF hybrid 300 has various advantages over a traditional passive distributed hybrid. In an exemplary embodiment, active RF hybrid 300 does not result in a loss of power, but instead has a gain or is at least gain neutral. In another exemplary embodiment, active RF hybrid 300 does not rely on distributed elements and is capable of operating over very wide bandwidths. In yet another exemplary embodiment, active RF hybrid 300 is manufactured as a MMIC and is compact. Furthermore, active RF hybrid 300 has a physical size that is independent of the operating frequency.

Vector Generator: In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signal from the current summer is modulated in at least one of amplitude and phase.

Figure 4:
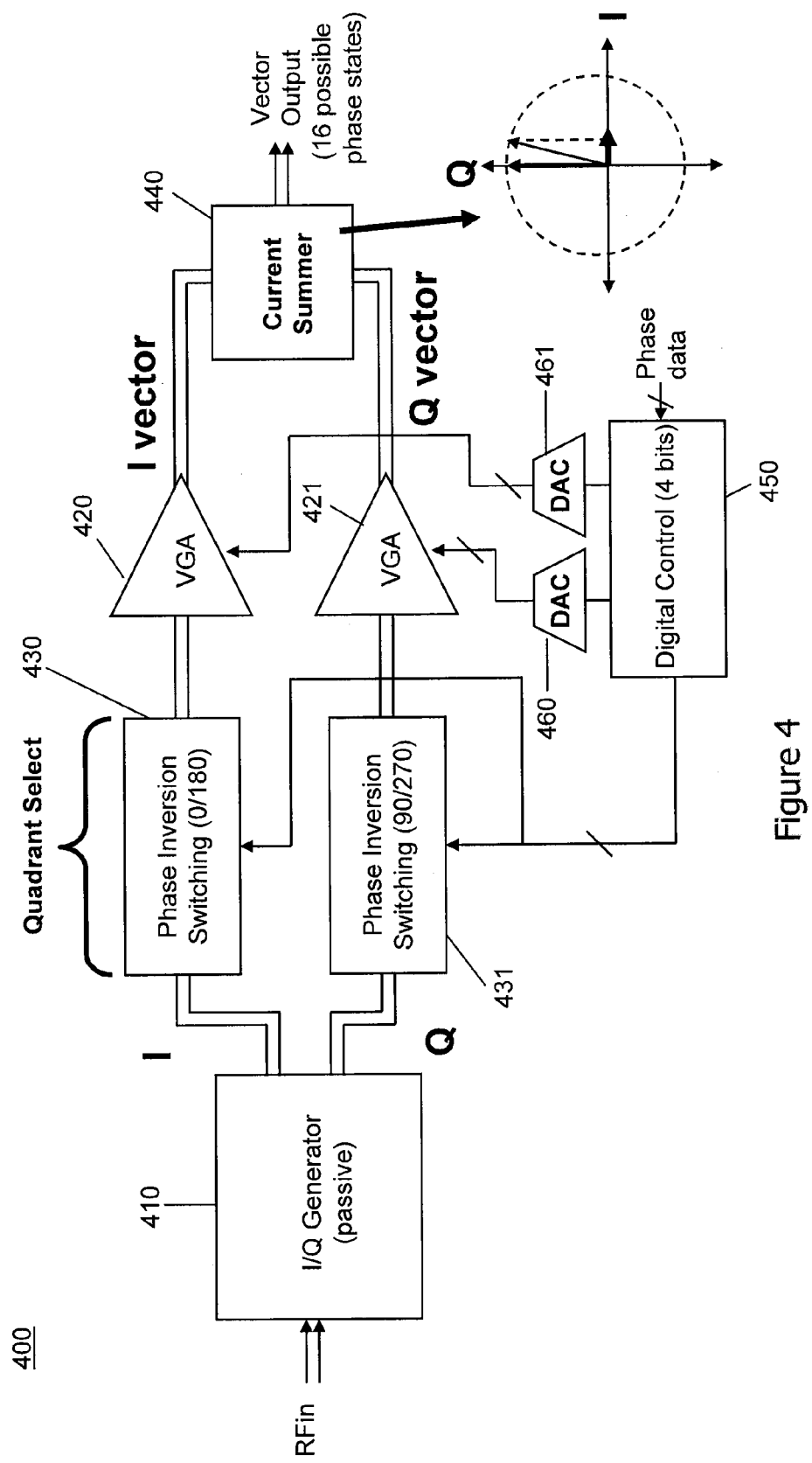
FIG. 4 illustrates an exemplary embodiment of an active vector generator.

In accordance with an exemplary embodiment and with reference to FIG. 4, a vector generator 400 comprises a passive I/Q generator 410, a first variable gain amplifier (VGA) 420 and a second VGA 421, a first quadrant select 430 and a second quadrant select 431 each configured for phase inversion switching, and a current summer 440. The first quadrant select 430 is in communication with I/Q generator 410 and first VGA 420. The second quadrant select 431 is in communication with I/Q generator 410 and second VGA 421. Furthermore, in an exemplary embodiment, vector generator 400 comprises a digital controller 450 that controls a first digital-to-analog converter (DAC) 460 and a second DAC 461. The first and second DACs 460, 461 control first and second VGAs 421, 420, respectively. Additionally, digital controller 450 controls first and second quadrant selects 430, 431.

In an exemplary embodiment, vector generator 400 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 400 or limited to various portions of vector generator 400. In another exemplary embodiment, the RF signals are communicated non-differentially. The I vector and Q vector are processed in parallel, each passing through the phase inverting switching performed by first and second quadrant selects 430, 431. The resultant outputs of the phase inverting switches comprise four possible signals: a non-inverted I, an inverted I, a non-inverted Q, and an inverted Q. In this manner, all four quadrants of a phasor diagram are available for further processing by VGAs 420, 421. In an exemplary embodiment, two of the four possible signals non-inverted I, inverted I, non-inverted Q, and inverted Q are processed respectively through VGAs 420, 421, until the two selected signals are combined in current summer 440 to form a composite RF signal. The current summer 440 outputs the composite RF signal with phase and amplitude adjustments. In an exemplary embodiment, the composite RF signal is in differential signal form. In another exemplary embodiment, the composite RF signals are in single-ended form.

In an exemplary embodiment, control for the quadrant shifting and VGA functions is provided by a pair of DACs. In an exemplary embodiment, reconfiguration of digital controller 450 allows the number of phase bits to be digitally controlled after vector generator 400 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 460, 461 can be made after vector generator 400 is fabricated in order to facilitate adjustment of the vector amplitudes.

Matrices

Described below are various specific fixed beam forming network embodiments for use in phased array antenna systems, specifically an exemplary Butler matrix and an exemplary Blass matrix. Though the exemplary beam forming network embodiments are described in terms of a transmit architecture, similar architectures could be implemented for receiving signals in a phased array antenna. Conversely, embodiments only described as receiving signals could be implemented for transmitting signals as well.

In accordance with an exemplary embodiment, a phased array antenna comprises active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the distributed network in the prior art, including lower cost, smaller physical size that is independent of operating frequency, wider operating bandwidths, and the ability to provide power gain rather than a power loss.

Additionally, other advantages over the prior art embodiments are possible, depending on the phased array architecture. Some of the advantages include extensive system flexibility and very compact antenna systems because no distributed structures are required. Furthermore, some embodiments employ differential signaling to improve signal isolation and interference rejection when the RF signal is in analog form.

Some other advantages include that RF signals undergo a neutral or slight positive power gain when being communicated through the antenna system, rather than power losses that occur in the passive prior art systems. For example, a typical prior art system can suffer losses of greater than 20 dB. Another advantage is that the antenna system is not band limited. In other words, the antenna system is applicable to all frequency bands, including X, K, Ku, Ka, and Q bands. In contrast, a typical prior art matrix may only over a narrow bandwidth, such as less than 10%. In an exemplary embodiment, the antenna system operates over specific frequency ranges, such as 2-20 GHz, 20-40 GHz, or 30-45 GHz. In an exemplary embodiment, the antenna system is capable of operating over multiple frequency bands simultaneously. For example, an exemplary antenna system may be configured to transmit a Ku-band signal and a Ka-band signal simultaneously.

Butler Matrix

A Butler matrix is a type of fixed beam forming network, in which each RF input into the matrix is connected to a unique beam output. In an exemplary embodiment, a Butler matrix is configured to operate over multiple frequency bands. In other words, the Butler matrix is capable of transmitting signals from different frequency bands simultaneously. For example, the Butler matrix can be configured to transmit or receive signals in the Ku-band and the Ka-band simultaneously.

Figure 5:
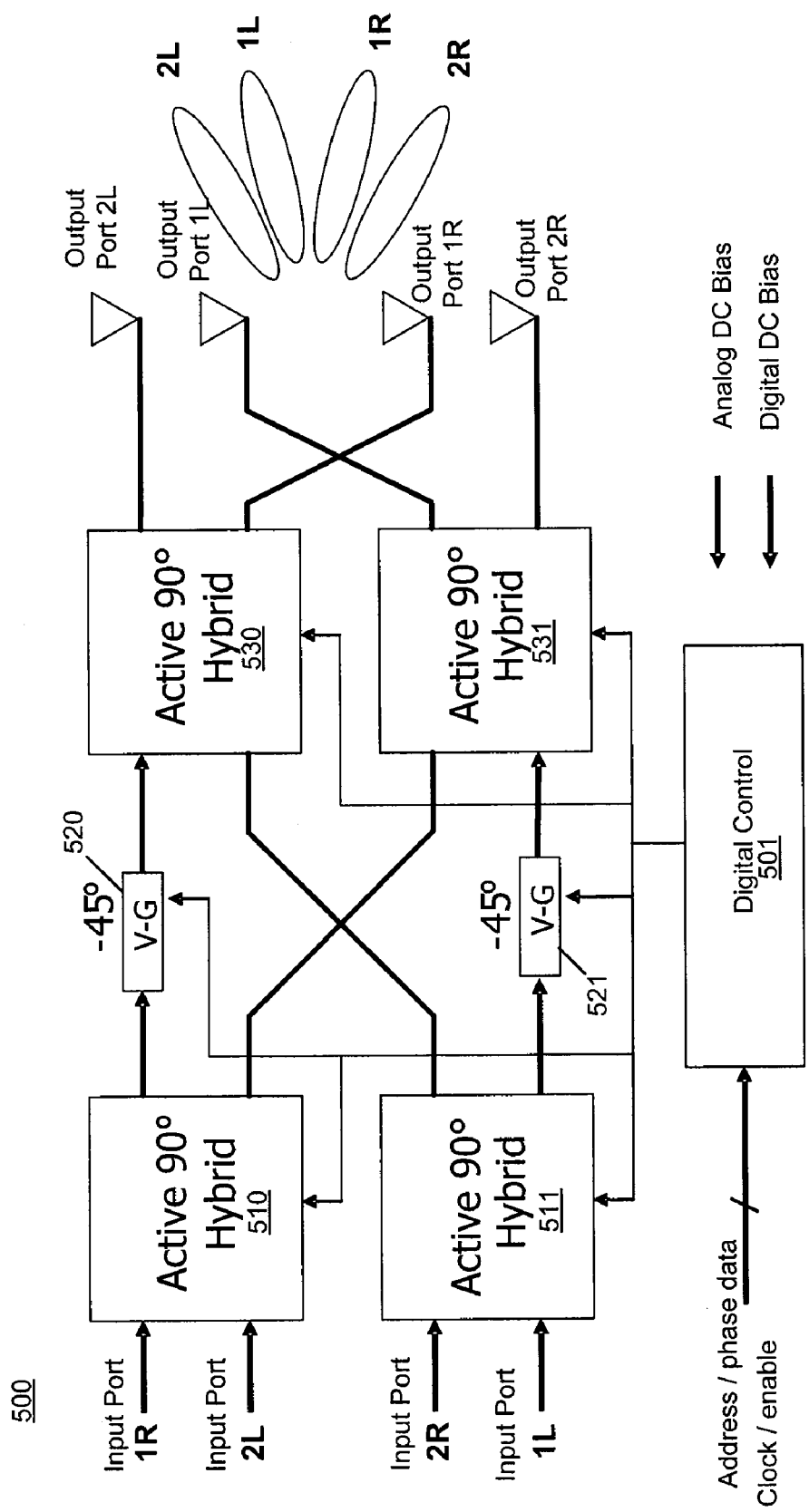
FIG. 5 illustrates an exemplary embodiment of a 4-beam active Butler matrix.

In accordance with an exemplary embodiment and with reference to FIG. 5, a 4-beam active Butler matrix 500 comprises a first active 90° hybrid 510 in parallel with a second active 90° hybrid 511, and a third active 90° hybrid 530 in parallel with a fourth active 90° hybrid 531. The active Butler matrix 500 further comprises a first vector generator 520 connected between the first and third active 90° hybrids 510, 530, and a second vector generator 521 connected between the second and fourth active 90° hybrids 511, 531. In an exemplary 4-beam active Butler matrix 500, vector generators 520, 521 are set for −45° phase. The active 90° hybrids 510, 511, 530, 531 may be, of similar description as active hybrid 300. Also, vector generators 520, 521 may be of similar description as vector generator 400. Furthermore, active Butler matrix 500 also comprises a digital controller 501. In an exemplary embodiment, digital controller 501 is configured to control the digital settings of some or all of these electronic components.

In accordance with an exemplary embodiment, digital controller 501 provides the I/Q phase and amplitude commands as well as the quadrant select commands to each of the vector generators used within active 90° hybrids 510, 511, 530, 531 as well as vector generators 520, 521. In an exemplary embodiment, if 4 bits of phase data were provided to each of the vector generators, a total of 40 bits of phase information would be managed by the digital controller 501. In another exemplary embodiment, analog and digital bias voltages are applied to the circuit. The digital voltage is used to power the DAC and digital controller functions while the analog voltage is used to power the RF functions. Keeping the analog and digital voltages separate serves to minimize the digital switching noise that may be induced onto the RF lines.

In an exemplary embodiment, Butler matrix 500 has four input ports and four output ports. In accordance with the exemplary embodiment; first active 90° hybrid 510 receives an input signal from Input Port 1R and another input signal from Input Port 2L. Furthermore, first active 90° hybrid 510 communicates a first signal to first vector generator 520 and a second signal to fourth active 90° hybrid 531. First active 90° hybrid 510 combines the two input signals and injects a 90° phase difference between the first signal and the second signal. In other words, in an exemplary embodiment, the second signal lags the first signal by 90°.

Likewise, second active 90° hybrid 511 receives an input signal from Input Port 2R and another input signal from Input Port 1L. Second active 90° hybrid 511 communicates a third signal to third active 90° hybrid 530 and a fourth signal to second vector generator 521. Second active 90° hybrid 511 combines the two input signals and injects a 90° phase difference between the third signal and the fourth signal.

In an exemplary embodiment, third active 90° hybrid 530 receives a first vector generator signal from first vector generator 520 and the third signal from second active 90° hybrid 511. Third active 90° hybrid 530 outputs a first output signal to Output Port 2L and a second output signal to Output Port 1R. Third active 90° hybrid 530 combines the first vector generator signal and the third signal and injects a 90° phase difference between the first output signal and the second output signal.

Similarly, fourth active 90° hybrid 531 receives a second vector generator signal from second vector generator 521 and the second signal from first active 90° hybrid 510. Fourth active 90° hybrid 531 outputs a third output signal to Output Port 1L and a fourth output signal to Output Port 2R. Fourth active 90° hybrid 531 combines the second vector generator signal and the second signal and injects a 90° phase difference between the third output signal and the fourth output signal.

Furthermore, in accordance with an exemplary embodiment, any portion of active Butler matrix 500 may implement differential signaling. For example, differential signaling may be used to communicated signals between at least one of first active 90° hybrid 510 to first vector generator 520, first active 90° hybrid 510 to fourth active 90° hybrid 531, second active 90° hybrid 511 to second vector generator 521, and second active 90° hybrid 511 to third active 90° hybrid 530. Furthermore, differential signaling may be used to communicate signals between at least one of first vector generator 520 to third active 90° hybrid 530, and second vector generator 521 to fourth active 90° hybrid 531. Additionally, differential signaling may be used at the input ports and/or the output ports.

The capability and size of an active Butler matrix is scalable, depending on the desired number of beams to form. In an exemplary embodiment, the number of active 90° hybrids is equal to $N/2*\log_2(N)$, where N is the number of desired beams formed by the matrix. The number of vector generators is equal to $N/2*[\log_2(N)-1]$, where N is the number of desired beams formed by the matrix. Butler matrices are generally limited to 2^N topologies, though there is no limit to the overall number of beams.

Figure 6:
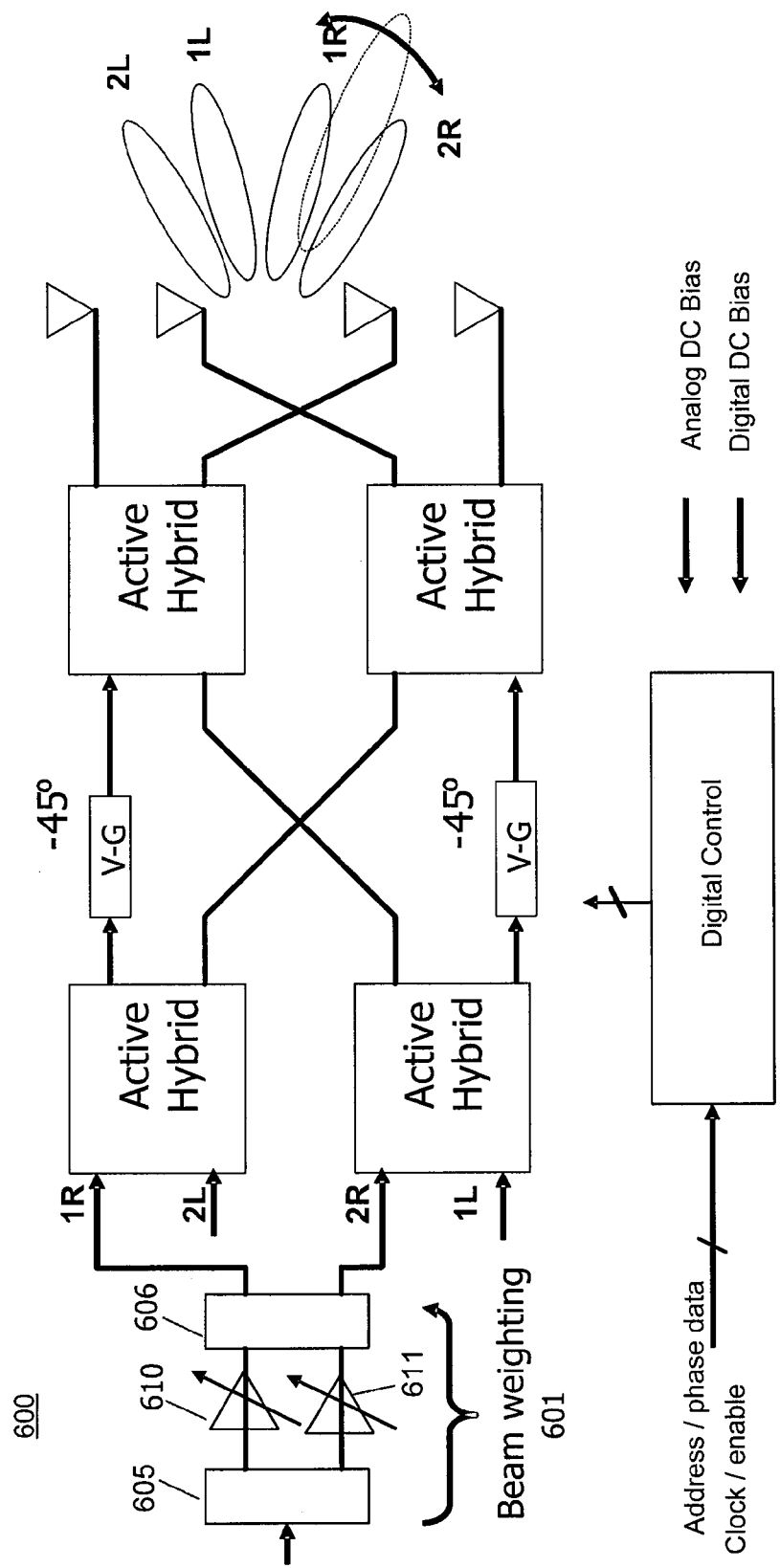
FIG. 6 illustrates another exemplary embodiment of a 4-beam active Butler matrix.

In accordance with an exemplary embodiment and with reference to FIG. 6, a 4-beam active Butler matrix 600 comprises a similar architecture to Butler matrix 500. As such, the similar architecture of active Butler matrix will not be explained in detail. However, Butler matrix 600 further comprises a beam weighting portion 601 configured to adjust the beam portion of the input signal(s). The beam weighting function allows any two adjacent beams to be combined into a composite beam that may be steered anywhere within the space contained between the two original beams. Since prior art Butler matrices do not offer steerable beams, this additional capability is an advantage that may be applied in various applications. In an exemplary embodiment, beam weighting portion 601 comprises an active power splitter 605, an active 90° hybrid 606, a first VGA 610, and a second VGA 611. Active power splitter 605 may be of similar description as active power splitter 100. Active 90° hybrid 606 may be of similar description as active hybrid 300. Beam weighting portion 601 receives an input signal and splits the input signal into two input signals, 1R and 2R. This allows the 1R and 2R input signals to form a single "sum" output beam. By varying the relative gains of first VGA 610 and second VGA 611, this "sum" beam can be scanned anywhere between the 1R and 2R output beam positions. Thus, this network provides limited scan between adjacent beams. Moreover, one skilled in the art can appreciate that this method can be applied to any adjacent beams, such as 2L and 1L, or 1L and 2R.

Figure 7:
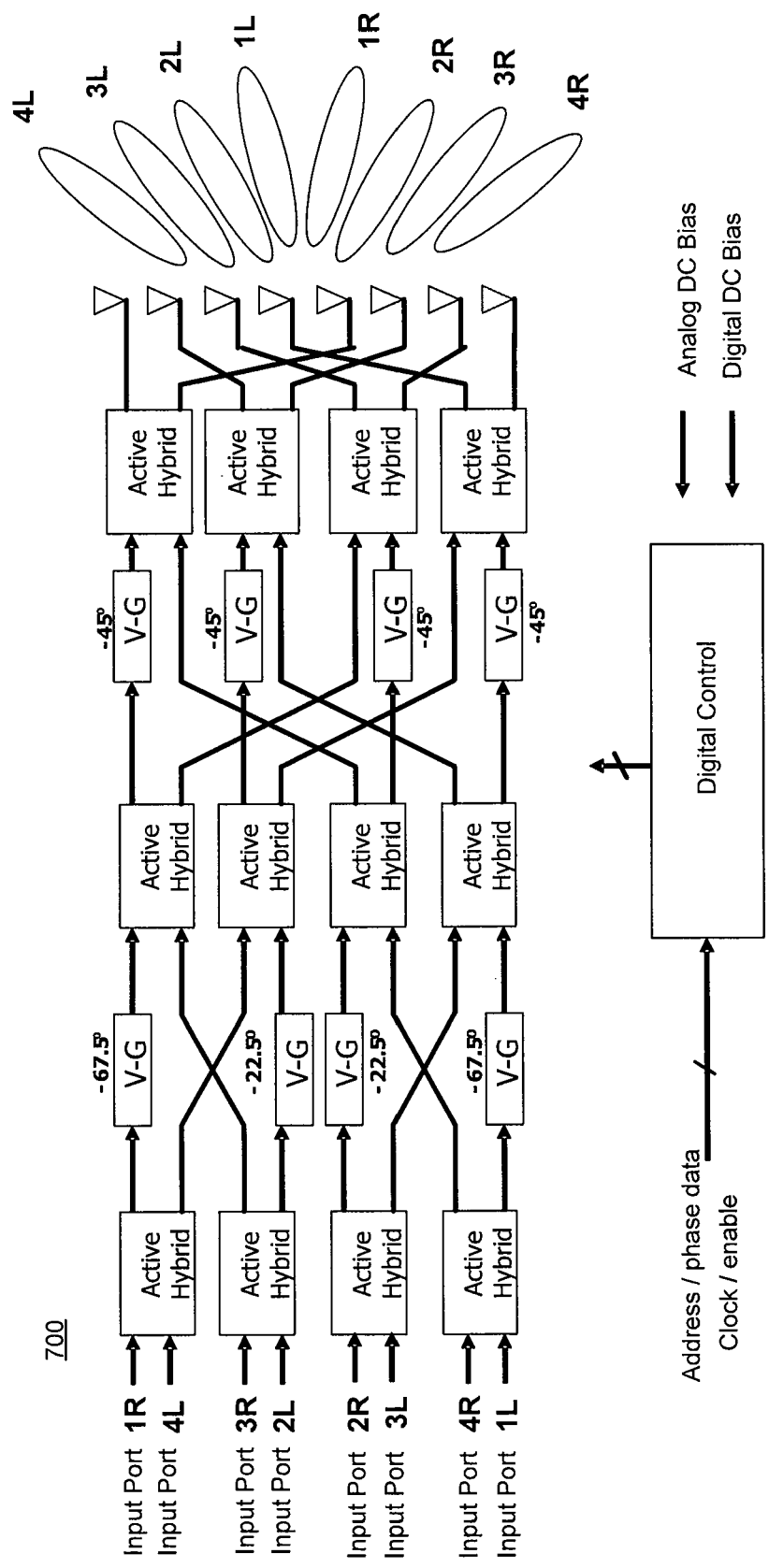
FIG. 7 illustrates an exemplary embodiment of an 8-beam active Butler matrix.

In accordance with an exemplary embodiment and with reference to FIG. 7, an 8-beam active Butler matrix 700 comprises multiple active 90° hybrids and multiple vector generators. In the exemplary embodiment, Butler matrix 700 further comprises eight input ports and eight output ports. As illustrated by FIG. 7, Butler matrix 700 is similar to the Butler matrices described in detail above, but scaled to communicate eight beams. The input signal to output beam direction mapping is the same as described for 4-beam active Butler matrix 500: input signal 1R maps to beam direction 1R, input signal 2L maps to beam direction 2L, and so on. The other functions within 8-beam active Butler matrix 700 operate the same, or substantially the same, to those within 4-beam active Butler matrix 500. Since the architecture and function of the Butler matrix 700 is an extrapolation of active Butler matrix 500, the specific architecture and signal paths will not be described in detail.

Figure 8:
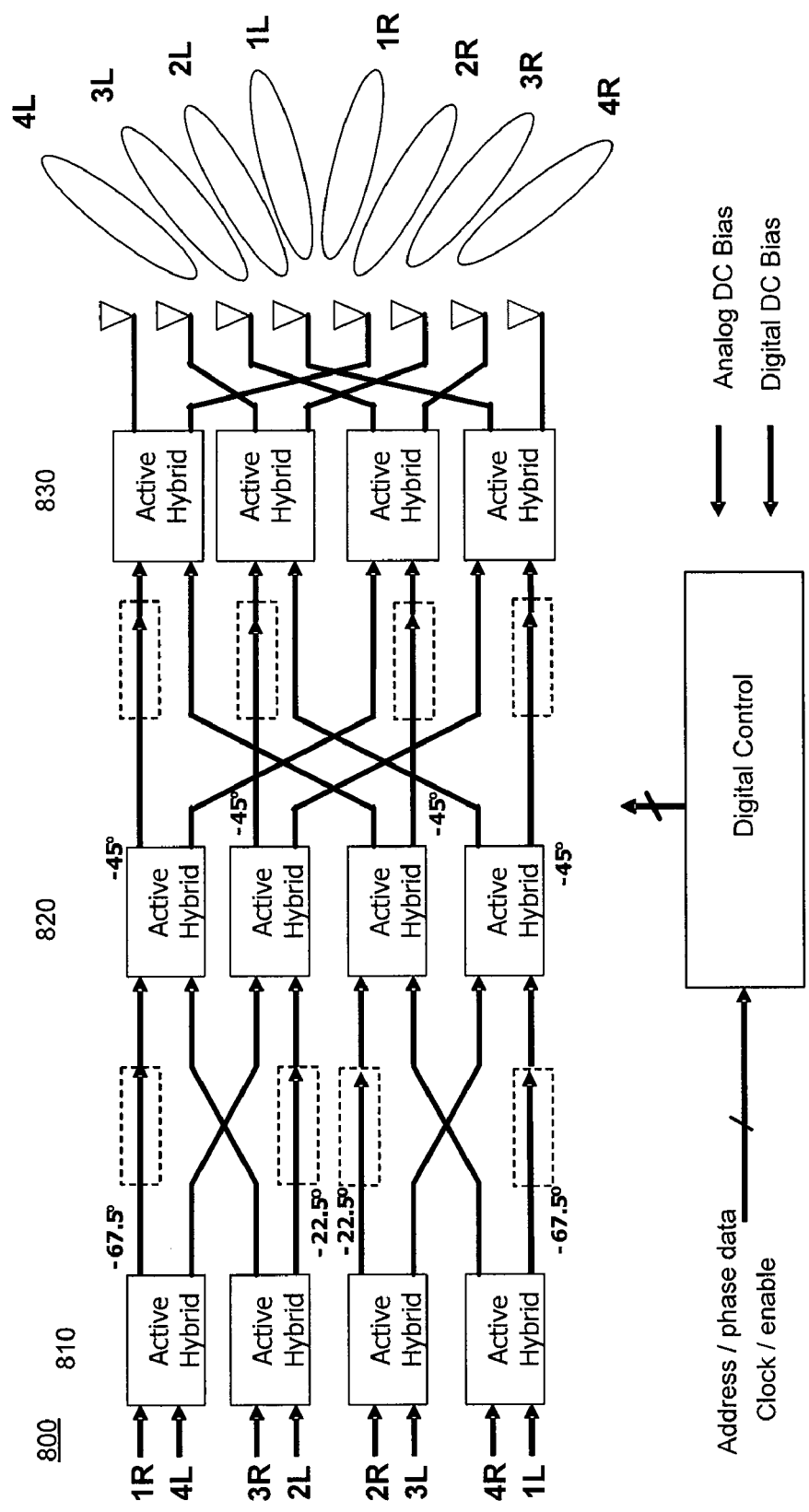
FIG. 8 illustrates another exemplary embodiment of an 8-beam active Butler matrix.

In another exemplary embodiment and with reference to FIG. 8, an 8-beam active Butler matrix 800 is similar to the 8-beam active Butler matrix 700, except Butler matrix 800 eliminates all of the stand-alone vector generators. The appropriate delay line merely has its thru-phase adjusted to include the phase delay effect of the respective vector generator that originally occupied that position.

Specifically, in an exemplary embodiment, active Butler matrix 800 comprises a first stage of active hybrids 810, a second stage of active hybrids 820, and a third stage of active hybrids 830. Active hybrids 810, 820, 830 may be of similar description as active hybrid 300. In this particular embodiment, all active hybrids are nominally 90° hybrids.

In an exemplary embodiment, active Butler matrix 800 has eight input ports and eight output ports (inputs 1R-4R & 1L-4L, outputs 1R-4R & 1L-4L). In accordance with an exemplary embodiment, first stage of active hybrids 810 receives input signals from the eight input ports; two input signals to each of the four active hybrids in first stage 810. Each of first stage of active hybrids 810 combines two input signals and generates two output signals with a nominal 90° relative phase delay. Each of first stage of active hybrids 810 then communicates the two output signals to second stage of active hybrids 820 through delay lines. The signals communicated between first stage 810 and second stage 820 undergo various phase delays injected by the active hybrids. First stage of active hybrids 810 individually transmit two signals to second stage 820, where one of the two transmitted signals has no phase delay and the other signal has a phase delay. For example, signals may have a phase delay of 0°, −22.5°, or −67.5° injected as shown in FIG. 8. This is in contrast to the 90° phase delay injected in Butler matrix 700.

In second stage of active hybrids 820, each active hybrid receives two phased delay signals from first stage 810, and combines the two input signals into two output signals with a nominal 90° relative phase shift. The first of the two input signals has a −67.5° phase delay and the second of the input signals has no phase delay. As illustrated by FIG. 8, the output signals of second stage of active hybrids 820 are wired such that an output signal of one active hybrid is mingled with an output signal of another active hybrid.

In third stage of active hybrids 830, each active hybrid receives two phase delayed signals from second stage 820, and combines the two input signals into two output signals with a nominal 90° relative phase delay. The first of the two output signals has a −45° phase delay and the second of the output signals has no phase delay. The outputs from third stage 830 are the beam outputs pointing in a unique fixed direction. Analogous to active Butler matrix 700, Butler matrix 800 maps each input signal into a single beam pointed in a unique direction.

Blass Matrix

A Blass matrix is another type of fixed beam forming network that provides for beams fixed in space. The Blass matrix establishes the number of beams formed independent of the number of radiating elements. However, a Blass matrix typically has more components than a Butler matrix, resulting in a heavier and costlier beam forming network.

Figure 9:
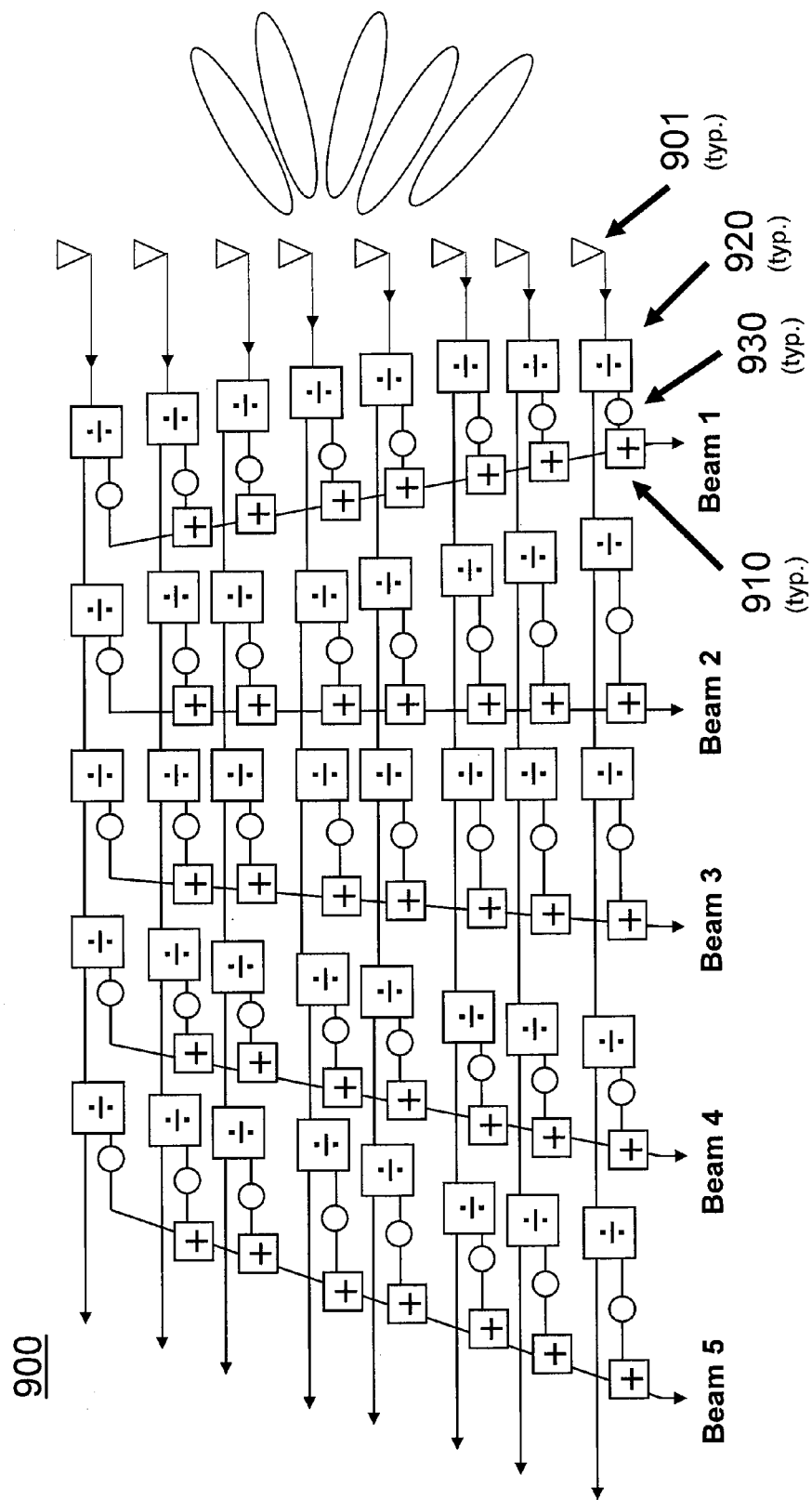
FIG. 9 illustrates an exemplary embodiment of an active Blass matrix configured for receive applications.

In accordance with an exemplary embodiment, and with reference to FIG. 9, an active Blass matrix 900 configured for receive applications comprises a plurality of active power combiners 910, active power splitters 920, and vector generators 930. Active power splitters 920 may be of similar description as active power splitter 100. Active power combiners 910 may be of similar description as active power combiner 200. Vector generators 930 may be of similar description as vector generator 400. In an exemplary receive embodiment, multiple radiating elements 901 receive RF signals and communicate the signals to active Blass matrix 900. Blass matrix 900 is made up of multiple active Blass matrix subunits. In an exemplary embodiment, an active Blass matrix subunit comprises an active power combiner 910, an active power splitter 920, and a vector generator 930. The active Blass matrix subunit is part of a grid of subunits arranged into columns and rows. In an exemplary embodiment, each row is associated with an individual radiating element and each column forms an individual beam.

In the exemplary embodiment, active power splitter 920 divides the RF signal energy, with a fraction being communicated to vector generator 930 and the remaining signal energy being communicated to an adjacent Blass matrix subunit in the same row. The vector generator 930 phase shifts the RF signal in a manner consistent with orienting Beam 1 in a desired physical direction. The output signal of vector generator 930 is communicated to active power combiner 910 as a first input signal. Furthermore, in an exemplary embodiment, active power combiner 910 also receives a second input from the adjacent Blass matrix subunit in the same column. The second input signal is combined with the first input signal to form a Blass matrix subunit output signal. In an exemplary embodiment, each column of vector generators facilitates the forming of a phase front and results in a beam being pointed in the desired physical direction. To achieve the beam forming, the phase delay injected by vector generator 930 is based on the size of active Blass matrix 900, the position of the individual active Blass matrix subunit within active Blass matrix 900, and the desired beam pointing direction. A phase gradient is formed across each column of vector generators to support beam formation in a unique direction. The phase gradient is formed by ensuring that the delta phase between adjacent vector generators within the column is kept constant.

In an exemplary embodiment, within each row an active power splitter 920 communicates the received RF signal to the next active power splitter within the same row, where the next active power splitter is identical in function to active power splitter 920. When the new column of vector generators receives the signals from the preceding column of power splitters, a new phase gradient can be established across the new column to support a new beam. In this fashion each beam is individually steerable and independent of each other. In other words, each column thus corresponds to particular beam independent of the other beams. In an exemplary embodiment, each row of active power combiners 910 sequentially combines the signal energy from the columns to form the output beams.

In an exemplary embodiment, the effective coupling values (or gains) of the active splitters and active combiners are adjusted using bias control of the differential amplifiers or small value resistive attenuators. As can be appreciated by one skilled in the art, in another exemplary embodiment, each beam can be independently steered by varying the phase fronts of the individual columns. Thus, this invention provides for individual steerable beams which are not possible with a prior art distributed circuit based Blass matrix, which can only produce non-steerable beams.

Furthermore, in accordance with an exemplary embodiment, portions of active Blass matrix 900 may implement differential signaling. For example, differential signaling may be used to communicate signals between at least one of active power combiners 910, active power splitters 920, and vector generators 930. Furthermore, differential signaling may also be implanted to communicate a signal with the input ports and/or output ports.

Figure 10:
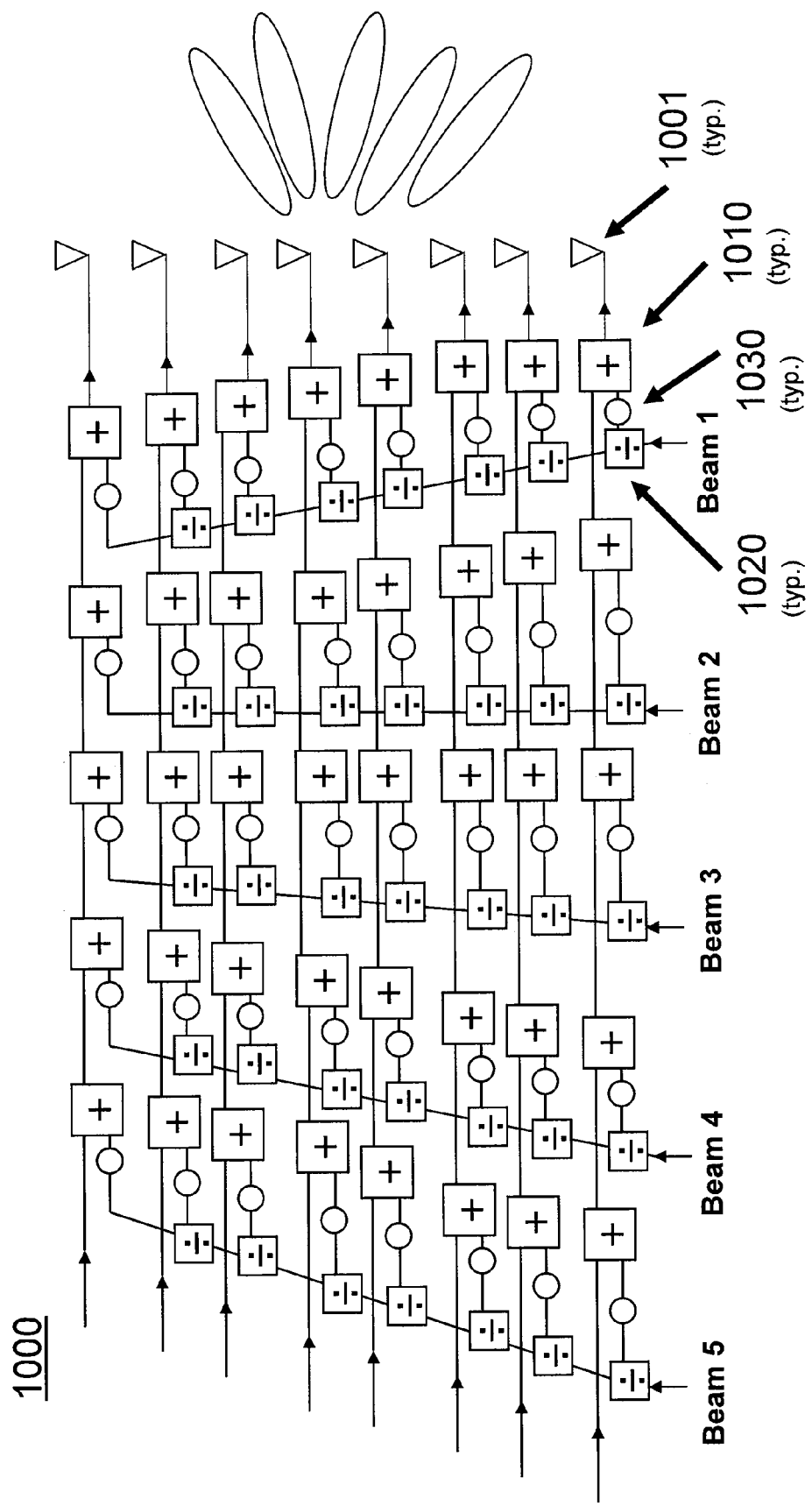
FIG. 10 illustrates an exemplary embodiment of an active Blass matrix configured for transmit applications.

In addition to the receive embodiment described above, a Blass matrix may also be configured to transmit. In accordance with an exemplary embodiment and with reference to FIG. 10, an active Blass matrix 1000 configured for transmit applications communicates signals to multiple radiating elements 1001 to transmit the resulting RF signals. The structure of an exemplary transmit embodiment is similar to the structure of the exemplary receive embodiment. Notably, active Blass matrix 1000 comprises an arrangement of active Blass matrix subunits into columns and rows. However, the structure of the active Blass matrix subunit changes between a transmit embodiment and a receive embodiment. In an exemplary transmit embodiment, an active Blass matrix subunit comprises active power combiner 1010, active power splitter 1020, and vector generator 1030. Active power splitter 1020 divides an input signal into two signals. The first of the divided signals is communicated to an adjacent active Blass matrix subunit in the same column. The second of the divided signals is communicated to active power combiner 1010 after passing through vector generator 1030. Active power combiner 1010 is configured to combine the second divided signal with a signal received from an adjacent active Blass matrix subunit in the same row. In the exemplary embodiment, active power combiner 1010 communicates a combined output signal to the next adjacent active Blass matrix subunit or radiating element 1001.

The following applications are related to this subject matter: U.S. application Ser. No. 12/759,043, entitled "ACTIVE HYBRIDS FOR ANTENNA SYSTEMS," which is being filed contemporaneously herewith; U.S. application Ser. No. 12/759,064, entitled "ACTIVE FEED FORWARD AMPLIFIER," which is being filed contemporaneously herewith; U.S. application Ser. No. 12/759,130, entitled "ACTIVE PHASED ARRAY ARCHITECTURE," which is being filed contemporaneously herewith; U.S. application Ser. No. 12/759,059, entitled "MULTI-BEAM ACTIVE PHASED ARRAY ARCHITECTURE," which is being filed contemporaneously herewith; U.S. application Ser. No. 12/758,996, entitled "PRESELECTOR AMPLIFIER," which is being filed contemporaneously herewith; U.S. application Ser. No. 12/759,148, entitled "ACTIVE POWER SPLITTER," which is being filed contemporaneously herewith; U.S. application Ser. No. 12/759,112, entitled "HALF-DUPLEX PHASED ARRAY ANTENNA SYSTEM," which is being filed contemporaneously herewith; U.S. application Ser. No. 12/759,113, entitled "DIGITAL AMPLITUDE CONTROL OF ACTIVE VECTOR GENERATOR," which is being filed contemporaneously herewith; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. An active Butler matrix comprising at least one active hybrid and at least one vector generator, wherein the at least one vector generator comprises a first quadrant select in parallel with a second quadrant select and a first variable gain amplifier in parallel with a second variable gain amplifier.

2. The active Butler matrix of claim 1, wherein the active Butler matrix is made of SiGe.

3. The active Butler matrix of claim 1, wherein the active Butler matrix is configured to operate over multiple frequency bands simultaneously.

4. The active Butler matrix of claim 1, further comprising differential signaling to increase signal isolation.

5. The active Butler matrix of claim 1, wherein a signal communicated through the active Butler matrix does not incur a signal power loss.

6. The active Butler matrix of claim 1, wherein the active Butler matrix forms at least one steerable beam.

7. A 4-beam active Butler matrix comprising:
a first active 90° hybrid configured to receive a first input signal and a second input signal;
a second active 90° hybrid configured to receive a third input signal and a fourth input signal;
a third active 90° hybrid in communication with the first active 90° hybrid and the second active 90° hybrid, wherein the third active 90° hybrid is configured to transmit a first output signal to a first radiating element and transmit a second output signal to a second radiating element;
a fourth active 90° hybrid in communication with the first active 90° hybrid and the second active 90° hybrid, wherein the fourth active 90° hybrid is configured to transmit a third output signal to a third radiating element and transmit a fourth output signal to a fourth radiating element;
a first vector generator in communication with the first active 90° hybrid and the third active 90° hybrid, wherein the first vector generator receives a signal from the first active 90° hybrid and outputs a first vector generator signal with a 45° phase delay; and
a second vector generator in communication with the second active 90° hybrid and the fourth active 90° hybrid, wherein the second vector generator receives a signal from the second active 90° hybrid and outputs a second vector generator signal with a 45° phase delay;
wherein the third, active 90° hybrid receives the first vector generator signal and a signal from the second active 90° hybrid; and
wherein the fourth active 90° hybrid receives the second vector generator signal and a signal from the first active 90° hybrid.

8. An active Blass matrix subunit of a plurality of Blass matrix subunits arranged in a grid, the active Blass matrix subunit comprising:
an active splitter configured to receive an input signal from at least one of a radiating element or a first adjacent Blass matrix subunit, wherein the active splitter divides the input signal into a first output signal and a second output signal;

a vector generator configured to receive the first output signal from the active splitter and generate a phase adjusted output signal, wherein the vector generator comprises first quadrant select in parallel with a second quadrant select and a first variable gain amplifier in parallel with a second variable gain amplifier; and an active combiner configured to receive the second output signal from the active splitter and receive a second input signal from a second adjacent Blass matrix subunit, wherein the active combiner generates a combined Blass matrix subunit output signal.

9. The active Blass matrix subunit of claim 8, wherein a beam is formed by sequentially combining the combined Blass matrix subunit output signal from a column of the plurality of Blass matrix subunits in the grid array.

10. The active Blass matrix of claim 9, wherein the first adjacent Blass matrix subunit is in the same row as the active Blass matrix subunit, and wherein the second adjacent Blass matrix subunit is in the same column as the active Blass matrix subunit.

11. An active Blass matrix comprising a row of columns comprising:

a plurality of active Blass matrix subunits (ABMS), wherein each of the plurality of ABMS comprises an active power splitter, an active power combiner, and a vector generator, wherein each active power splitter in each of the plurality of ABMS receives an input signal and outputs a first divided signal to the vector generator and a second divided signal to the active power combiner;

multiple columns of the plurality of ABMS, wherein the output of the active power combiner of each of the plurality of ABMS in each of said multiple columns of the plurality of ABMS is summed to form a beam for the respective column;

multiple rows of the plurality of ABMS, wherein the input signal of each of the plurality of ABMS in each of said multiple rows of the plurality of ABMS is received from the ABMS of an adjacent column in that row in a cascaded manner, wherein the first input signal in that row is from a radiating element.

12. The active Blass matrix of claim 11, wherein the active Blass matrix is configured to receive on multiple radiating elements, wherein each of the multiple radiating elements is associated with an individual row of the multiple rows, and wherein the active Blass matrix forms multiple beams, each of the multiple beams associated with an individual column of the multiple columns.

13. A beam forming network apparatus comprising:

at least four signal inputs and at least four signal outputs; and at least one active vector generator, wherein the at least one active vector generator comprises a first quadrant select in parallel with a second quadrant select and a first variable gain amplifier in parallel with a second variable gain amplifier.

14. The beam forming network apparatus of claim 13, wherein the beam forming network apparatus is configured to operate over multiple frequency bands simultaneously.

15. The beam forming network apparatus of claim 13, further comprising differential signaling to increase signal isolation.

16. The beam forming network apparatus of claim 13, wherein a signal communicated through the beam forming network apparatus does not incur a signal power loss.

17. The beam forming network apparatus of claim 13, wherein the beam forming network apparatus forms at least one steerable beam.

* * * * *

UNITED STATES PATENT AND TRADEMARK OFFICE
CERTIFICATE OF CORRECTION

| | | |
|---|---|---|
| PATENT NO. | : 8,289,209 B2 | Page 1 of 1 |
| APPLICATION NO. | : 12/759123 | |
| DATED | : October 16, 2012 | |
| INVENTOR(S) | : David W. Corman et al. | |

It is certified that error appears in the above-identified patent and that said Letters Patent is hereby corrected as shown below:

Column 14, line 64, the word --array-- should be inserted after the word "grid". Please cancel the text of claim 8 from column 14, line 63 – column 15, line 15, and insert the following claim:

--8. An active Blass matrix subunit of a plurality of Blass matrix subunits arranged in a grid array, the active Blass matrix subunit composing:
    an active splitter configured to receive an input signal from at least one of a radiating element or a first adjacent Blass matrix subunit, wherein the active splitter divides the input signal into a first output signal and a second output signal;
    a vector generator configured to receive the first output signal from the active splitter and generate a phase adjusted output signal, wherein the vector generator comprises a first quadrant select in parallel with a second quadrant select and a first variable gain amplifier in parallel with a second variable gain amplifier; and
    an active combiner configured to receive the second output signal from the active splitter and receive a second input signal from a second adjacent Blass matrix subunit, wherein the active combiner generates a combined Blass matrix subunit output signal.--

Signed and Sealed this
Fourth Day of December, 2012

David J. Kappos
*Director of the United States Patent and Trademark Office*